(12) United States Patent
Bernard

(10) Patent No.: US 8,337,054 B2
(45) Date of Patent: Dec. 25, 2012

(54) LIGHTING DEVICE HAVING A RECTANGULAR ILLUMINANCE PATTERN

(75) Inventor: Stefano Bernard, Orbassano (IT)

(73) Assignee: C.R.F. Società Consortile per Azioni, Orbassano (Torino) (IT)

(*) Notice: Subject to any disclaimer, the term of this patent is extended or adjusted under 35 U.S.C. 154(b) by 357 days.

(21) Appl. No.: 12/556,149

(22) Filed: Sep. 9, 2009

(65) Prior Publication Data
US 2010/0080012 A1  Apr. 1, 2010

(30) Foreign Application Priority Data
Sep. 29, 2008  (EP) .................................. 08425637

(51) Int. Cl.
*F21V 5/04* (2006.01)
(52) U.S. Cl. ........................................ 362/335; 362/520
(58) Field of Classification Search .................. 362/333, 362/555, 335, 334, 520
See application file for complete search history.

(56) References Cited

U.S. PATENT DOCUMENTS

| | | | |
|---|---|---|---|
| 6,547,423 B2* | 4/2003 | Marshall et al. ............... | 362/333 |
| 7,300,185 B1 | 11/2007 | Ruffin et al. | |
| 7,348,723 B2* | 3/2008 | Yamaguchi et al. ........... | 362/335 |
| 7,422,347 B2* | 9/2008 | Miyairi et al. ................. | 362/335 |
| 7,621,657 B2* | 11/2009 | Ohkawa .................... | 362/311.01 |
| 7,798,679 B2* | 9/2010 | Kokubo et al. ................ | 362/335 |
| 7,824,049 B2* | 11/2010 | Kaneko et al. ............ | 362/311.02 |
| 2002/0051360 A1* | 5/2002 | Solodovnikov et al. ...... | 362/244 |
| 2006/0209558 A1* | 9/2006 | Chinniah et al. ............... | 362/545 |
| 2007/0070633 A1* | 3/2007 | Eynden .......................... | 362/346 |
| 2007/0263390 A1* | 11/2007 | Timinger et al. .............. | 362/308 |
| 2008/0043466 A1* | 2/2008 | Chakmakjian et al. ........ | 362/237 |

FOREIGN PATENT DOCUMENTS

| | | |
|---|---|---|
| EP | 1 962 014 | 8/2008 |
| WO | WO 00/24062 | 4/2000 |

OTHER PUBLICATIONS

European Search Report for EP 08425637.9 dated Mar. 19, 2009.

* cited by examiner

*Primary Examiner* — Alan Cariaso
(74) *Attorney, Agent, or Firm* — Nixon & Vanderhye P.C.

(57) ABSTRACT

A lighting device, suitable for example for urban lighting of interiors or exteriors, or for lighting of interiors and exteriors of motor vehicles, said device comprising a substantially plane substrate and one or more LED or chip-LED semiconductor light sources distributed over the substrate and electrically connected to conductive supply paths, an optical means associated to the semiconductor source or sources, designed to modify the direction of the rays of light emitted by said semiconductor source, said device being characterized in that said optical means is of a substantially semicylindrical shape and consequently has a substantially plane base, two side faces and a substantially cylindrical outer surface, said optical means has a cavity obtained starting from said base within the body of said optical means and designed to house the source or sources, said side faces and said cavity are obtained by means of a rotation about a longitudinal axis of a two-dimensional profile and are designed to reduce the transverse divergence of the beam of light at output from said device, said outer surface is of a substantially cylindrical shape and is designed to reduce the longitudinal divergence of the beam of light at output from said device; the lighting device forming the subject of the patent being characterized in that it is designed to generate an illuminance pattern or luminous-intensity pattern that is substantially uniform and has a substantially rectangular shape.

5 Claims, 15 Drawing Sheets

LIGHTING DEVICE HAVING A RECTANGULAR ILLUMINANCE PATTERN

This application claims priority to European Patent Application No. 08425637.9 filed 29 Sep. 2008, the entire contents of which is hereby incorporated by reference.

SUMMARY OF THE INVENTION

The present invention relates to lighting devices of the type comprising a substantially plane substrate and a semiconductor light source (LED or chip-LED) positioned on the substrate and electrically connected to conductive supply paths, suitable, for example, for urban lighting of interiors or exteriors, or for lighting of interiors and exteriors of motor vehicles, and more in general able to generate a beam of light characterized by illuminance or luminous-intensity patterns that are controlled, uniform, and have a substantially rectangular shape.

In the present description and in the ensuing claims, the expression "illuminance pattern" is used to indicate the distribution of illuminance, measured in lux (lumen/m$^2$), on an illuminated surface, i.e., how the luminous flux at output from the device will be distributed over the illuminated area of said surface. The expression "luminous-intensity pattern", instead, is used for describing the distribution of luminous intensity, measured in candelas (lumen/steradian), i.e., how the luminous flux at output from the device will be angularly distributed.

Lighting devices are known, which are designed to be coupled to a semiconductor light source (LED or chipLED) and are designed to generate pre-determined illuminance patterns. For example, Carclo or Fraen propose on the market lighting devices designed to generate illuminance patterns having a substantially central symmetry and a predetermined radius (and accordingly luminous-intensity patterns that are substantially symmetrical with respect to the direction of the optical axis and have a predetermined angular extension), or else illuminance patterns having an ellipsoidal shape with predetermined semiaxes of extension (and accordingly luminous-intensity patterns with angular extensions that differ in two directions orthogonal to one another).

Said lighting devices are characterized by a substantial axial symmetry about the main optical axis, and their optical behaviour is completely described by the profile of the cross section traced in a plane that contains said main optical axis.

With reference to FIGS. 1 and 2 of the annexed drawings, the rays of light emitted by the source 1 and having a direction such as to form with the optical axis 2 of the device an angle of less than a known value A impinge upon the central portion 3 of the profile of said device, said central portion 3 being considered together with the profile of the output surface 5 of the device that substantially constitutes the section of a spherical-plane lens designed to control the output divergence of said incident rays. The rays of light emitted by the source and having a direction such as to form with the optical axis of the device an angle greater than a known value A are reflected by total internal reflection (TIR) by the outer portion 4 of the profile of said device, said outer portion 4 being such as to control the divergence of said rays leaving the device. The divergence of the rays leaving the output surface 5 introduced by the spherical-plane central portion 3 and TIR outer portion 4, which determines the luminous-intensity pattern of the device, is likewise proportional to the overall extension of the illuminance pattern on a surface normal to the optical axis of the device and set at a known distance, said illuminance pattern being with central symmetry.

The device described previously has the output surface 5 which is substantially plane: in the case where said output surface 5 is made up of one or more cylindrical lenses set alongside one another in a preferential direction, then the angular divergence of the beam of rays exiting from said device will be increased in said preferential direction so that both the luminous-intensity pattern and the illuminance pattern generated by said device will assume an elliptical shape, with predetermined major and minor semiaxes of extension and with its major semi-axis oriented in said preferential direction.

The use of devices characterized by a substantially axial symmetry about the optical axis consequently enables substantially symmetrical illuminance patterns and luminous-intensity distributions to be obtained, which typically, however, are not uniform. The introduction of a supplementary optical power on the output surface 5 enables modification of said symmetry in order to obtain elliptical and typically non-uniform illuminance patterns and luminous-intensity distributions. However, in the case where it is desired to obtain illuminance patterns and/or luminous-intensity distributions of a rectangular shape, which are useful in numerous applications, and in the case where it is then desired for said profiles and/or distributions to be substantially uniform this type of approach does not appear to be effective.

It should be noted that the illuminance pattern generated by a lighting device in a plane set at distance d from the output surface of said device and the luminous-intensity pattern generated by said device will coincide (in terms of shape) generally only for so-called far-field conditions, i.e., when said distance d is approximately 10 times greater the linear extension of said output surface of the device. In so-called near-field conditions, i.e., when the distance d is less than approximately 10 times the linear extension of the output surface of the device, the shape of the luminous-intensity pattern generated by said device can differ even sensibly from the illuminance pattern generated in the plane. It consequently follows that:

a device optimized for working in far-field conditions has a luminous-intensity pattern generally coinciding with the illuminance pattern;

a device optimized for working in near field has a luminous-intensity pattern generally different from the illuminance pattern so that it is necessary to specify whether the optimization has been made for the illuminance pattern or for the luminous-intensity pattern.

The aim of the present invention is to overcome the limitations of the known art by providing a lighting device based upon semiconductor sources that are able to generate an illuminance pattern or luminous-intensity pattern that is substantially uniform and has a rectangular shape, suitable for example for urban lighting of interiors or exteriors, or for lighting interiors and exteriors of motor vehicles.

With a view to achieving the above purpose, the subject of the invention is a lighting device having the characteristics specified in claim 1.

In a first embodiment, which will hereinafter be referred to as "far-field lighting device", the device generates a substantially uniform illuminance pattern that has a rectangular shape in a plane set at a distance greater than 20 cm from said device (and, for what has been said previously, a consequent uniform luminous-intensity pattern that has a rectangular shape), said distance being measured in the main optical axis of the device and said plane being substantially perpendicular to said main optical axis.

In a second embodiment, which will hereinafter be referred to as "near-field lighting device", the device generates a substantially uniform illuminance pattern that has a rectangular shape in a plane set at a distance of less than 20 cm from said device, said distance being measured along the main optical axis of the device and said plane being substantially perpendicular to said main optical axis.

In a third embodiment, which will hereinafter be referred to as "near-field lighting device with controlled illuminance, the device generates a substantially uniform illuminance pattern that has a rectangular shape in a plane set at a distance of less than 20 cm from said device, said distance being measured along the main optical axis of the device and said plane being substantially perpendicular to said main optical axis. In the case of said third embodiment, the device according to the invention further comprises, in a position corresponding to said plane perpendicular to the optical axis, a secondary optical system designed to reduce the angular divergence in at least one direction normal to the main optical axis of the device.

In a fourth embodiment, which will hereinafter be referred to as "inclined-plane lighting device", the device generates a substantially uniform illuminance pattern that has a rectangular shape in a plane set at a known distance (measured along the main optical axis of the device), said plane being not perpendicular to said main optical axis.

BRIEF DESCRIPTION OF THE DRAWINGS

The invention will now be described with reference to the annexed drawings, which are provided purely by way of non-limiting example, and in which.

DETAILED DESCRIPTION OF THE INVENTION

In the figures listed above, for reasons of clarity, the source 1 is represented as a point source. However, the considerations set forth in what follows substantially apply also to extensive sources (given that the typical size of a LED source is of the order of hundreds of microns, up to approximately 1 mm for high-flux LED sources).

Figure 1:
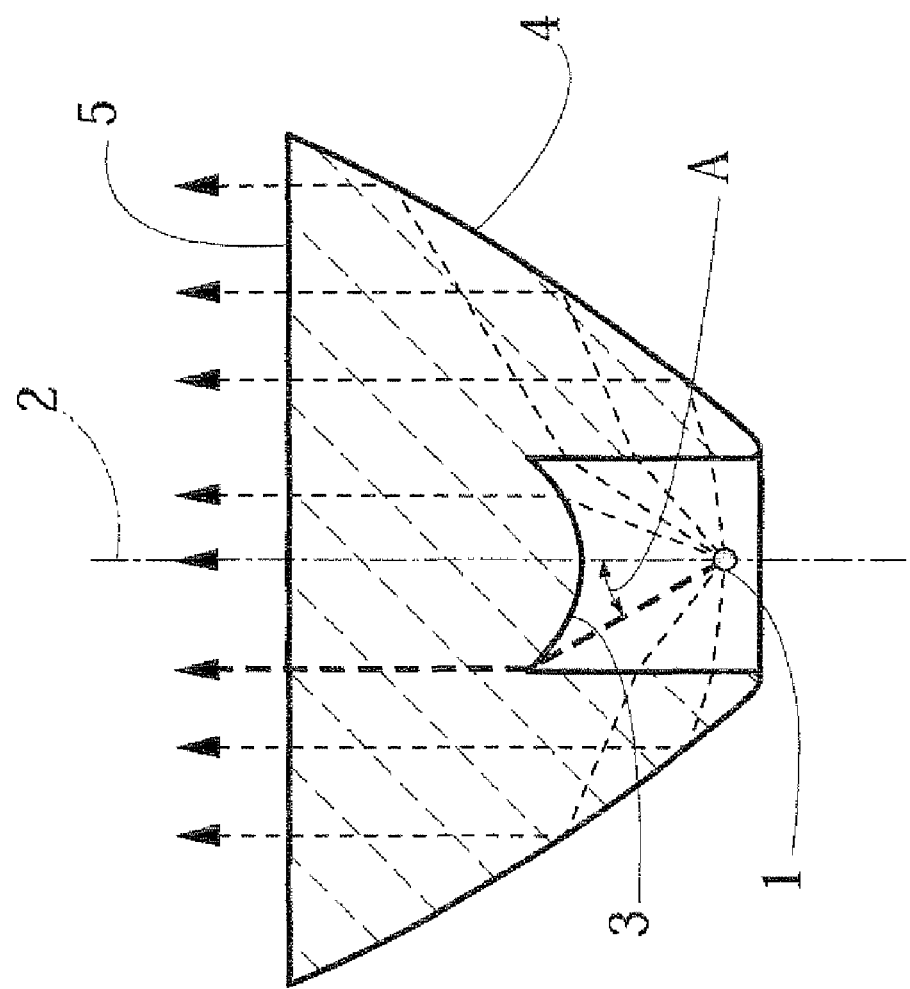
FIG. 1 illustrates the cross section and the typical optical path of the rays within a device according to the known art, according to what has been already described above.
Figure 2:
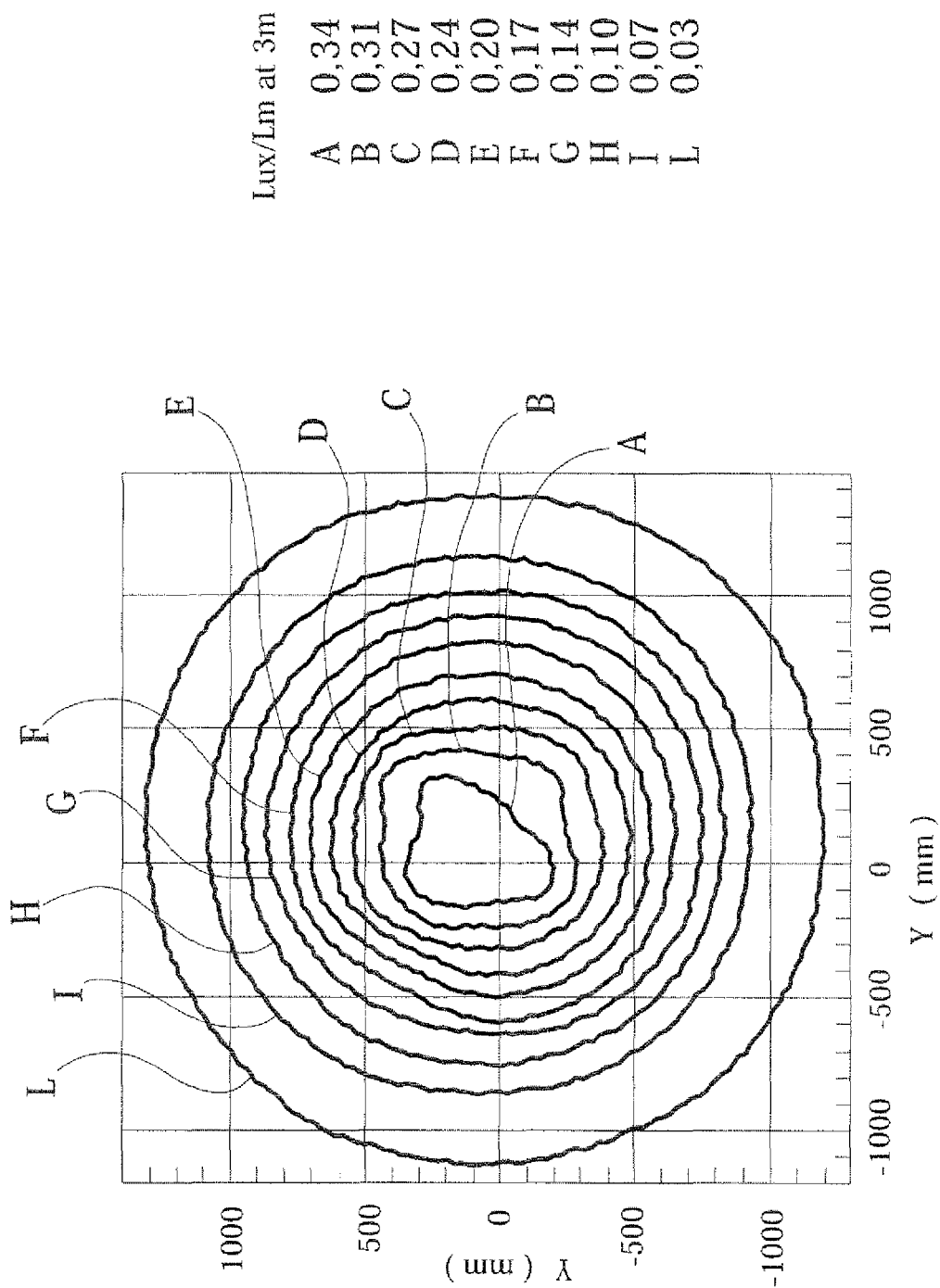
FIG. 2 illustrates an illuminance pattern according to the known art.
Figure 3:
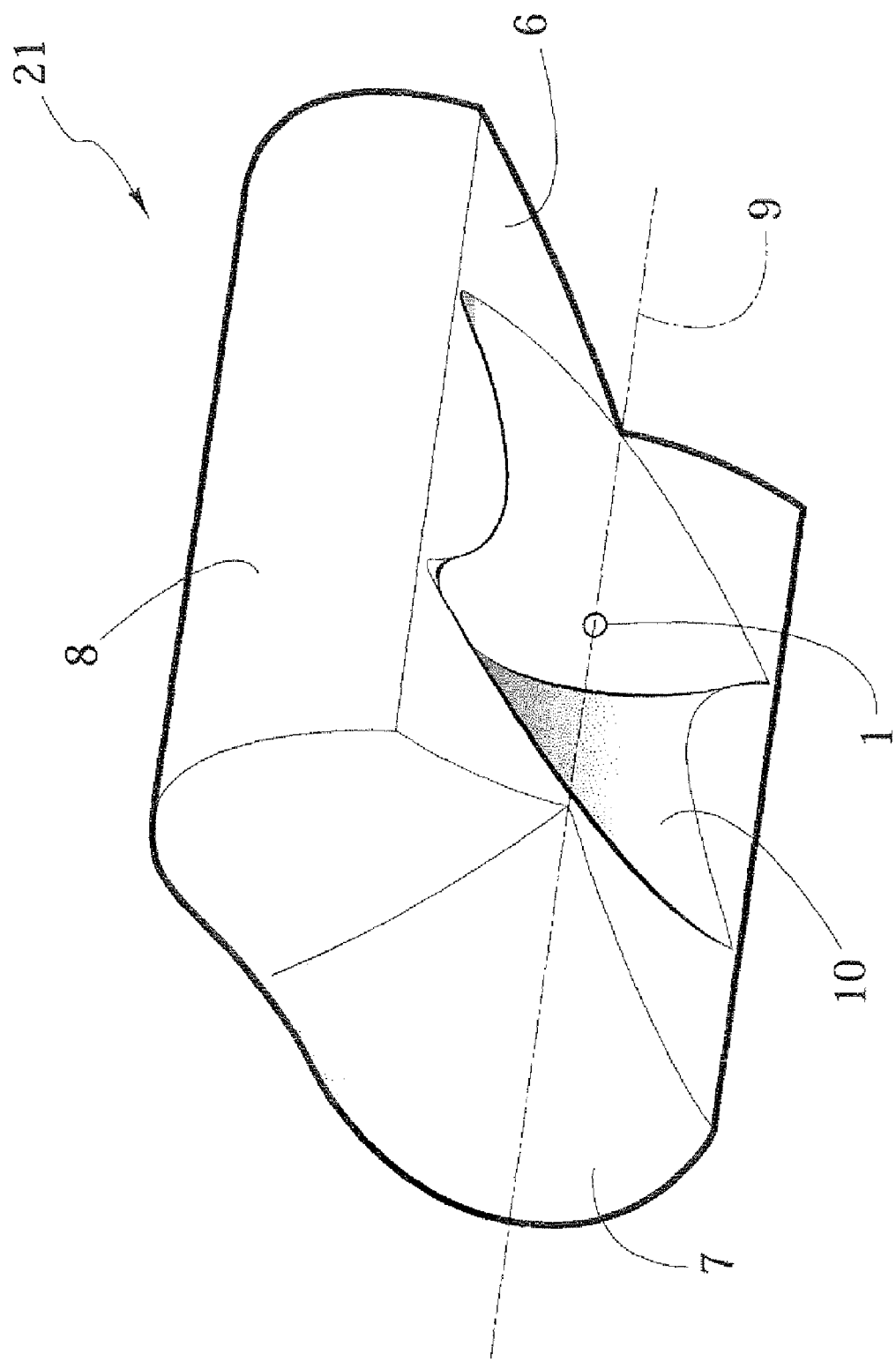
FIG. 3 is a schematic view of a generic embodiment of the device according to the invention.
Figure 4:
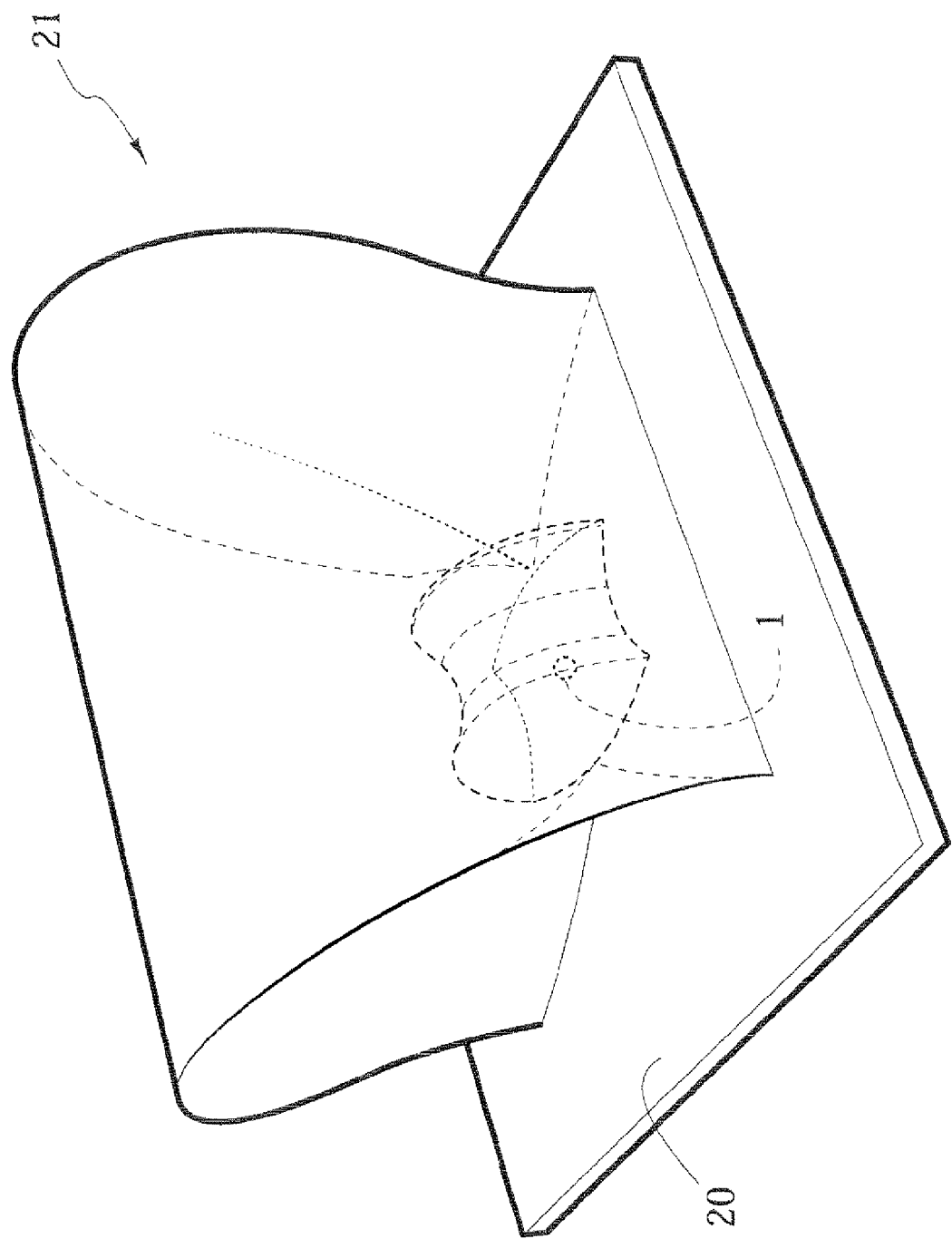
FIG. 4 illustrates a further schematic view of a generic embodiment of the device according to the invention.

The device forming the subject of the present patent presents in general as a full body of transparent material (designated as a whole by 21 in the annexed drawings), for example of material plastic (e.g., polycarbonate or polymethyl methacrylate) obtained for example with an injection process. The body 21 is substantially in the form of a half-cylinder, i.e., having the shape of one of the two halves obtained by sectioning a cylinder with a plane passing along its axis. With reference to FIG. 3, the substantially plane surface obtained from said section will be designated hereinafter as base 6 of the device, the remaining portions of the original bases of the cylinder 21 will be designated hereinafter as side faces 7 of the device, the remaining substantially cylindrical surface of the original surface of the cylinder will be designated hereinafter as outer surface 8 of the device 21 or output surface of the device 21, and the axis of the original cylinder will be designated hereinafter as longitudinal axis 9 of the device. The device has a cavity 10, having a substantially semicylindrical shape with axis substantially coinciding with the longitudinal axis 9 and obtained starting from the aforesaid base 6 and within the body of the device 21, hereinafter referred to as internal cavity, housed in which is the light source 1. The light source 1, which is of the LED or chipLED semiconductor type, is positioned on a substrate 20, substantially plane and parallel to the base 6 of the device, and is electrically connected to conductive supply paths. In a preferred embodiment, said source 1 lies in the proximity of the longitudinal axis 9.

In general terms, the device is aimed at creation of an illuminance pattern (and/or of a luminous intensity pattern) that is substantially uniform, has a rectangular shape, and has a predetermined extension. Said illuminance pattern (or luminous-intensity pattern) with a rectangular shape will present one of the sides substantially parallel to the longitudinal axis 9 of the device. The extension of said profiles considered in a direction parallel to said longitudinal axis 9 of the device will be designated as longitudinal extension of the illuminance pattern (and/or of the luminous-intensity pattern), whilst the extension considered in a direction perpendicular to said longitudinal axis 9 will be designated as transverse extension of the illuminance pattern (and/or of the luminous-intensity pattern). The axis having a direction normal to the base 6 and substantially passing through the source 1 will be designated hereinafter as main optical axis 2.

Figure 5:
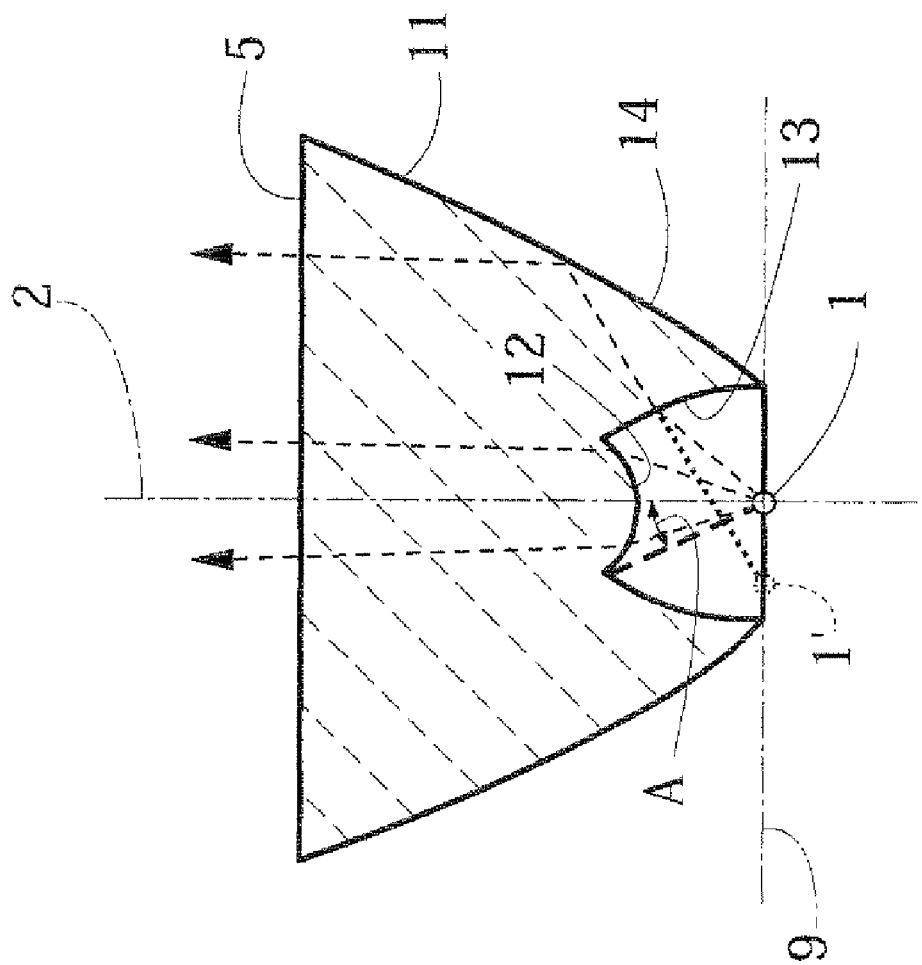
FIG. 5 illustrates the longitudinal section of the device of FIG. 3.

The surfaces of the side faces 7 and of the internal cavity 10 are principally designed for defining the longitudinal extension of the illuminance pattern (and/or of the luminous-intensity pattern), whilst the outer surface 8 is principally designed for defining the transverse extension of said patterns. With reference to FIG. 5, the surfaces of the side faces 7 and of the internal cavity 10 are obtained from the half-rotation, about the longitudinal axis 9, of a two-dimensional profile 11 designed to generate a predetermined divergence beam, said profile being constituted by:

a central internal portion 12 constituting substantially the section of an aspherical diopter;

two internal side portions 13 constituting each the section of an optical surface designed to create a virtual image 1' of the source 1, according to what will be illustrated in detail in what follows;

two side outer portions 14 constituting each the section of a surface designed to reflect in total internal reflection (TIR) the incident rays; and a top outer portion 5 constituting the cross section of the surface 8 from which preferably the rays of light leave the optical device, said portions being such as to control the output longitudinal divergence of the incident rays.

Consider in fact for simplicity the rays emitted by the source 1 in the plane containing the two-dimensional profile 11, as presented in FIG. 5. The rays of light emitted by the source 1 and having a direction such as to form with the main optical axis 2 of the device an angle of less than a known value A impinge upon the central portion 12 of the profile, said central portion 12, considered together with the top portion 5 of the device, substantially constituting the section of a plane-aspherical lens designed to control the output divergence of said incident rays. The rays of light emitted by the source 1 and having a direction such as to form with the main optical axis 2 of the device an angle greater than the aforesaid known value A are refracted in the passage within the body 21 of the device through the side portion 13, said portion 13 being designed to create, for the rays emitted in the plane containing the profile 11, a virtual image 1' of the source 1; said rays of light are reflected by total internal reflection (TIR) by the outer portion 4 of the profile 11 of said device, said outer portion 4 being of a shape such as to control the divergence at output from the device of said rays through the top portion 5. For example, the outer portion 4 of the profile 11 can be:

- a portion of parabolic curve, with focus substantially coinciding with the virtual source 1/, in such a way that the rays of light will be reflected by TIR by said outer portion 4 in a direction substantially parallel to the main optical axis 2;
- a portion of ellipse, with one of the focuses substantially coinciding with the virtual source 1', in such a way that the rays of light will be reflected by TIR by said outer portion 4 so as to form a distribution with angular divergence and preferential direction depending upon the position of the second focus of said ellipse.

The divergence of the rays leaving the output surface 5 and introduced principally by the spherical-plane central portion 3 and by the outer portion 4 operating in TIR is likewise linked to the overall extension of the illuminance pattern on a surface, typically plane, set at a known distance.

In a preferred embodiment, the central portion 12, the side portion 13, and the outer portion 14 are such that the device forms a luminous-intensity pattern having a cross section that is substantially uniform.

In a further preferred embodiment, the central portion 12, the side portion 13, and the outer portion 14 are such that the device forms an illuminance pattern in a plane perpendicular to the main optical axis 2 having a transverse profile that is substantially uniform.

In a further preferred embodiment, the central portion 12, the side portion 13, and the outer portion 14 are such that the device forms an illuminance pattern, in a plane not orthogonal to the main optical axis 2, having a substantially uniform transverse profile.

Figure 6:
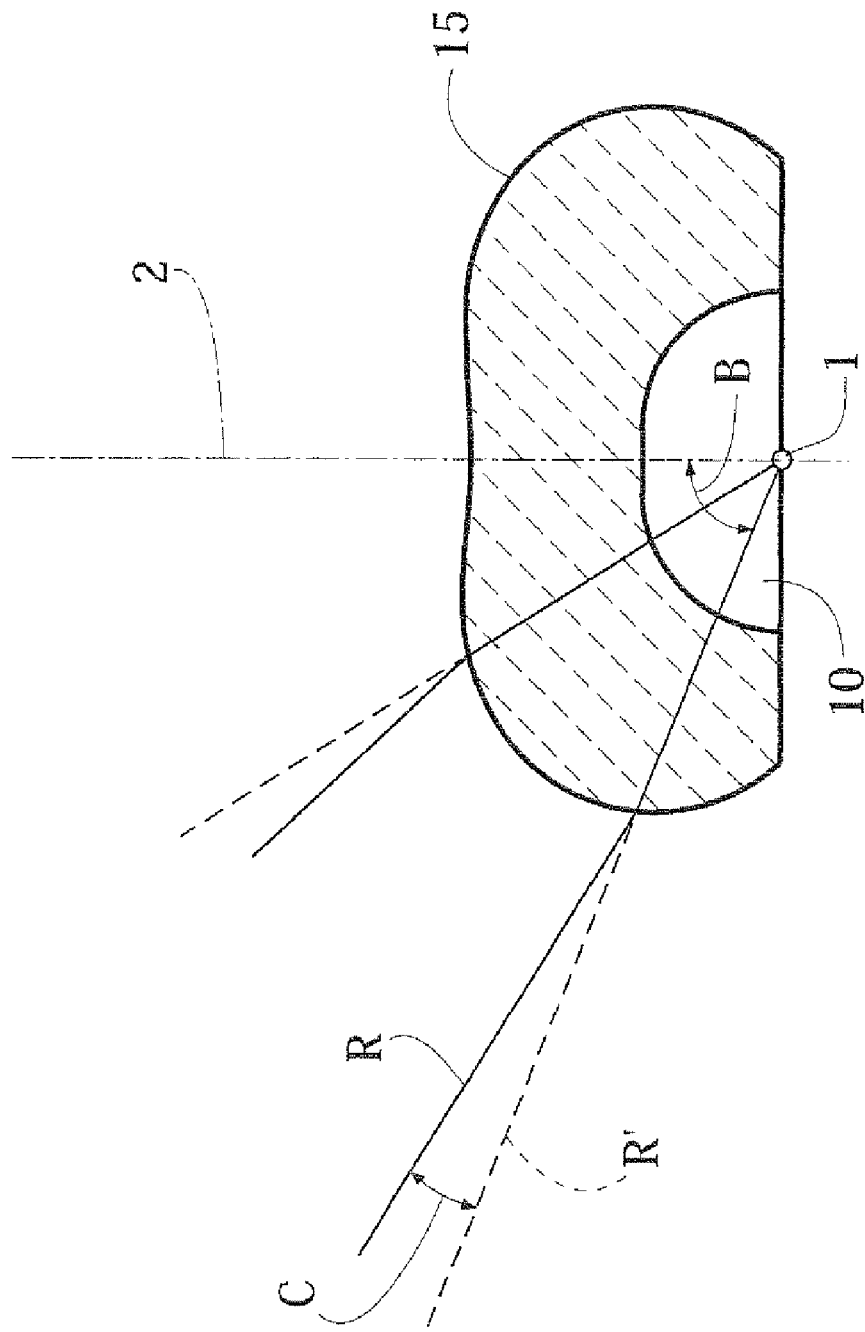
FIG. 6 illustrates the cross section of the device of FIG. 3.

The outer surface 8 is that of a substantially cylindrical lens, extending along the longitudinal axis and having a profile 15 such as to control the transverse divergence of the rays leaving the device. With reference to FIG. 6 and if:

B is the angle comprised between the direction of the rays of light emitted by the source 1 projected in the plane containing the profile 15 and the main optical axis 2 projected in said plane containing the profile 15, R is the direction, projected in said plane containing the profile 15, of a generic ray of light leaving the outer surface 8, R' is the direction, projected in said plane containing the profile 15, of the same generic ray of light emitted by the source 1 prior to refraction on the outer surface 8, C is the angle comprised between said direction R and said direction R', we find that the profile 15 is such that:

$$C = f(B)$$

where f is a typically monotonic increasing function, such as to determine a reduction in the angular divergence of the rays emitted by the device and a predetermined luminous-intensity pattern (or illuminance pattern).

In a preferred embodiment, the profile 15 is such that the device forms a luminous-intensity pattern having a substantially uniform longitudinal section.

In a further preferred embodiment, the profile 15 is such that the device forms an illuminance pattern in a plane perpendicular to the main optical axis 2 having a substantially uniform longitudinal profile.

In a further preferred embodiment, the profile 15 is such that the device forms an illuminance pattern, in a plane not orthogonal to the main optical axis 2, having a substantially uniform longitudinal profile.

It thus follows that the device, in principle, controls separately and in succession the longitudinal divergence of the beam of light emitted (principally by means of the surfaces constituting the internal cavity 10 and the side faces 7) and the transverse divergence of said beam (principally by means of the outer surface 8). From the conceptual standpoint, traversal of the outer surface 8 in the first case, and traversal of the internal cavity 10 and/or reflection on the side faces 7, the second case, do not affect significantly the principle of operation of the device.

Figure 7:
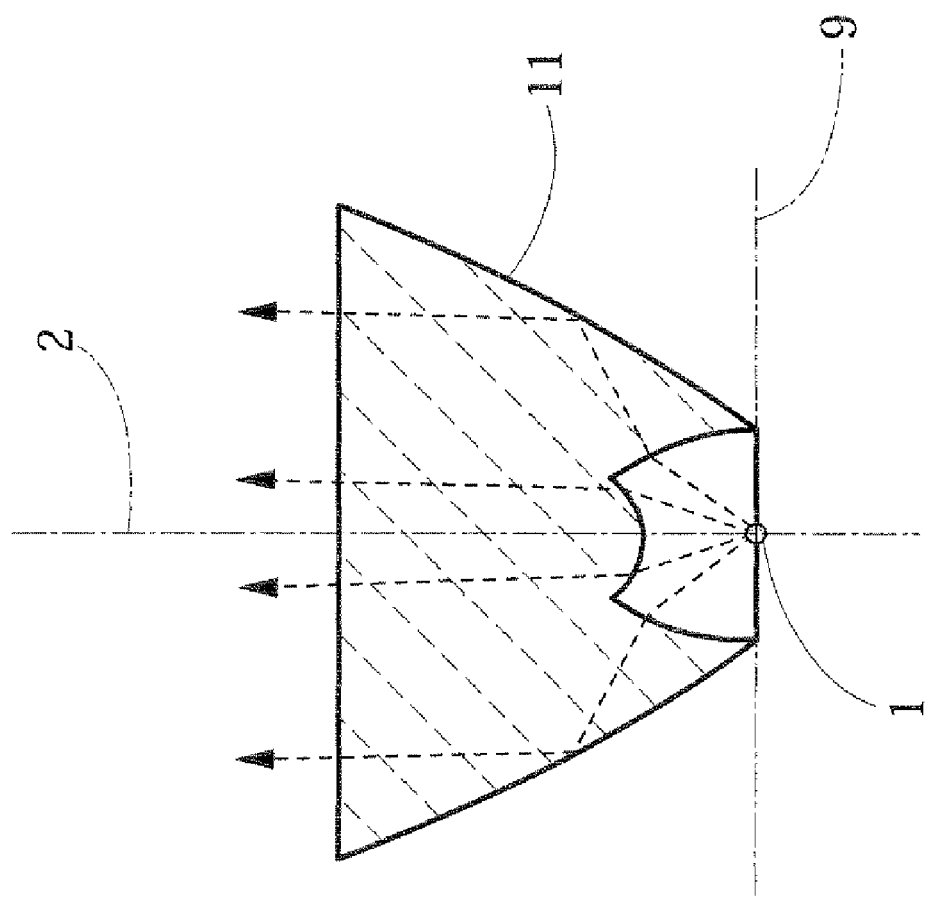
FIG. 7 illustrates the longitudinal section of a first preferred embodiment of the device according to the invention.
Figure 8:
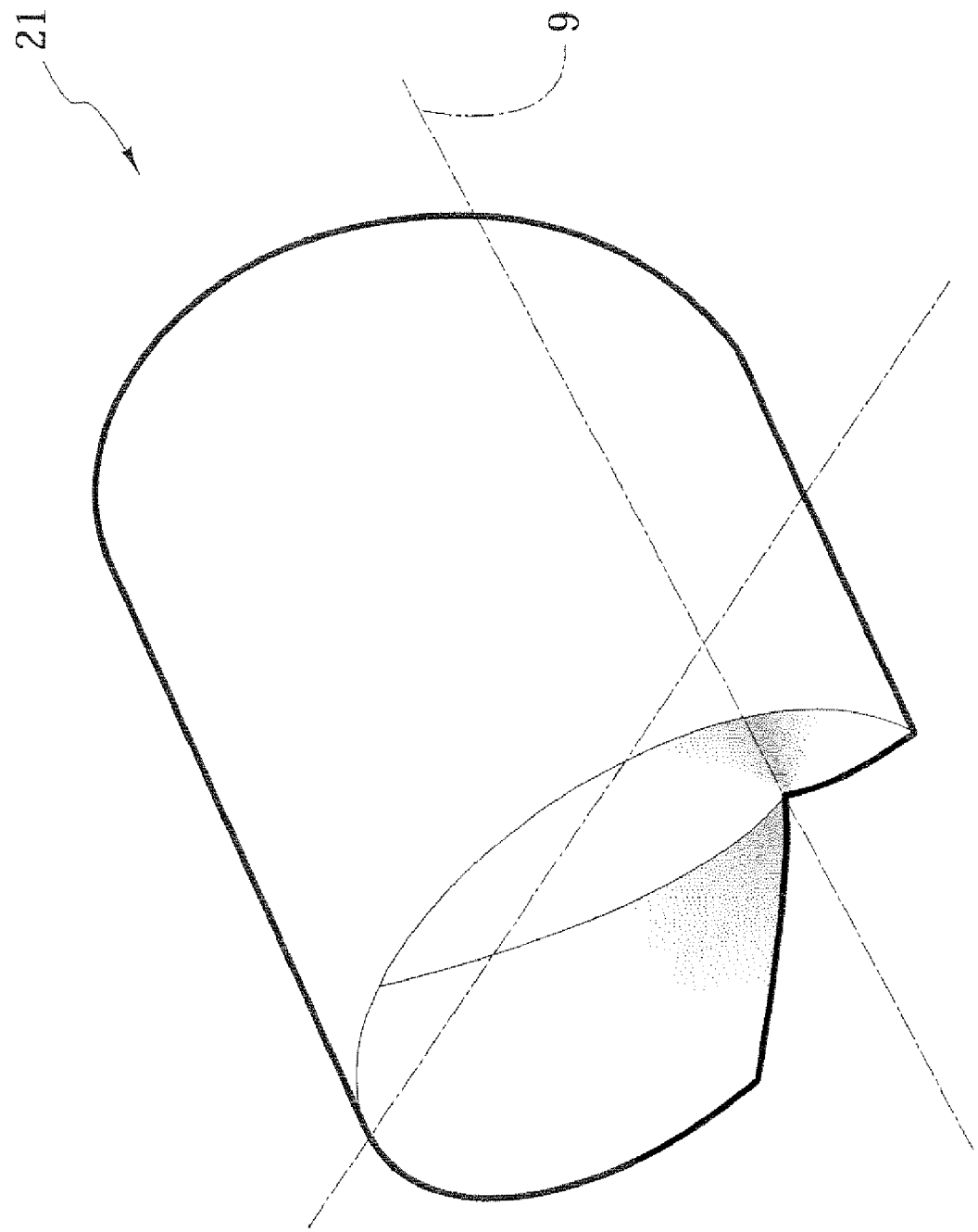
FIG. 8 is a perspective schematic view of the first preferred embodiment of the device according to the invention.
Figure 9:
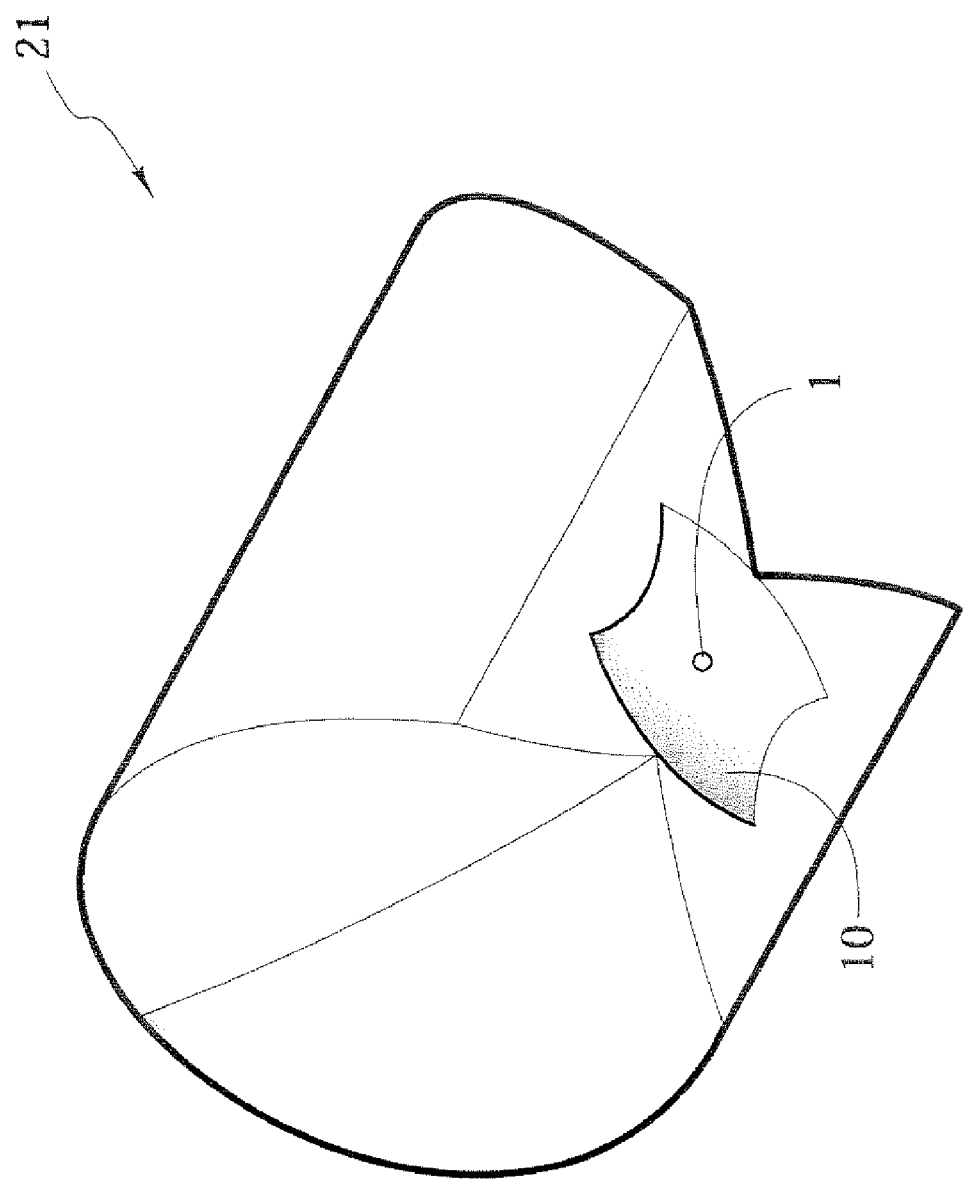
FIG. 9 is a further perspective schematic view of the first preferred embodiment of the device according to the invention.
Figure 10:
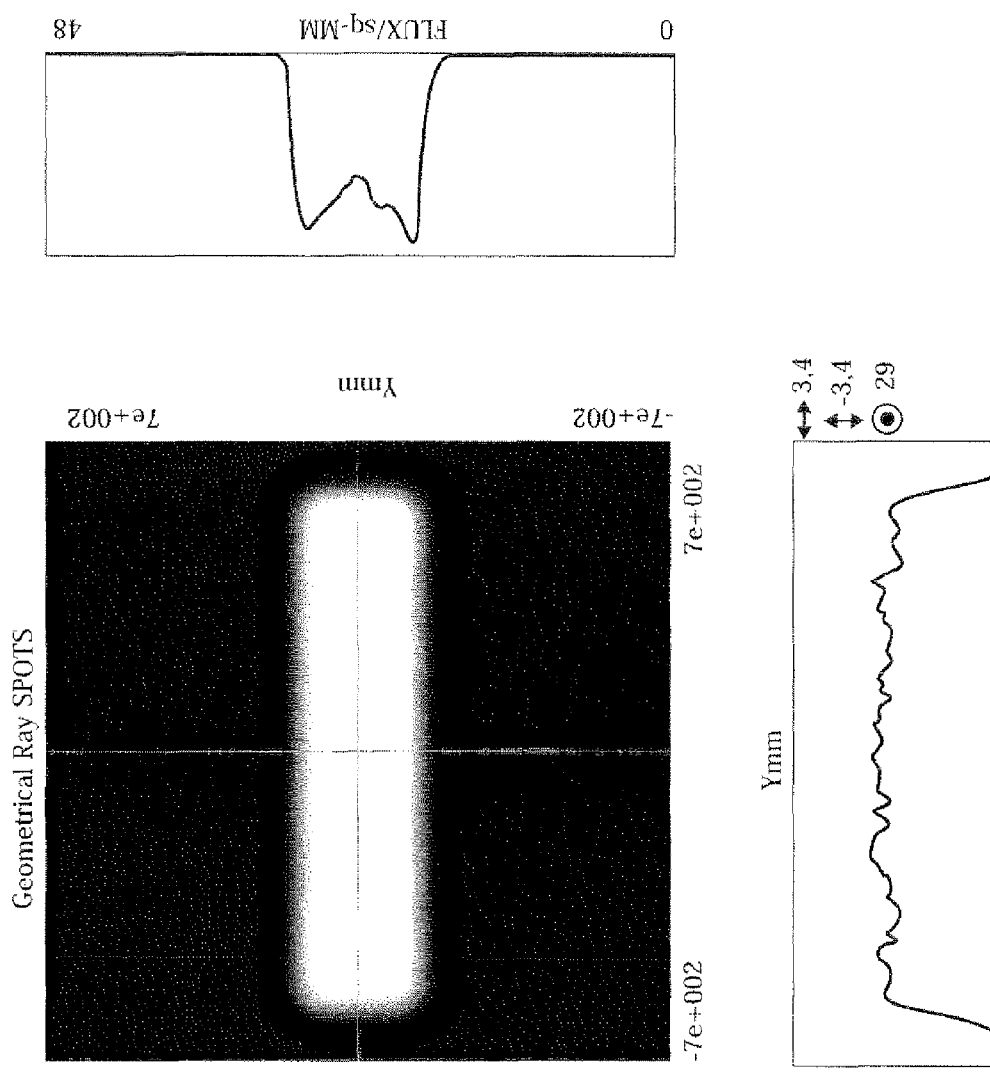
FIG. 10 illustrates the illuminance pattern and the corresponding luminous-intensity patterns of the first preferred embodiment of the device according to the invention.

A first preferred embodiment of the device according to the invention is illustrated in FIGS. 7 to 9. In the case of said first embodiment, the device forming the subject of the present patent is optimized in the form of far-field lighting device. The profile of the transverse section 11 is optimized to contain the divergence of the output beam of rays within a predetermined value (calculated as a function of the distance of the surface to be illuminated and of the linear extension of the illuminance pattern). FIG. 10 illustrates the illuminance pattern and the corresponding luminous-intensity patterns of said first preferred embodiment.

Figure 11:
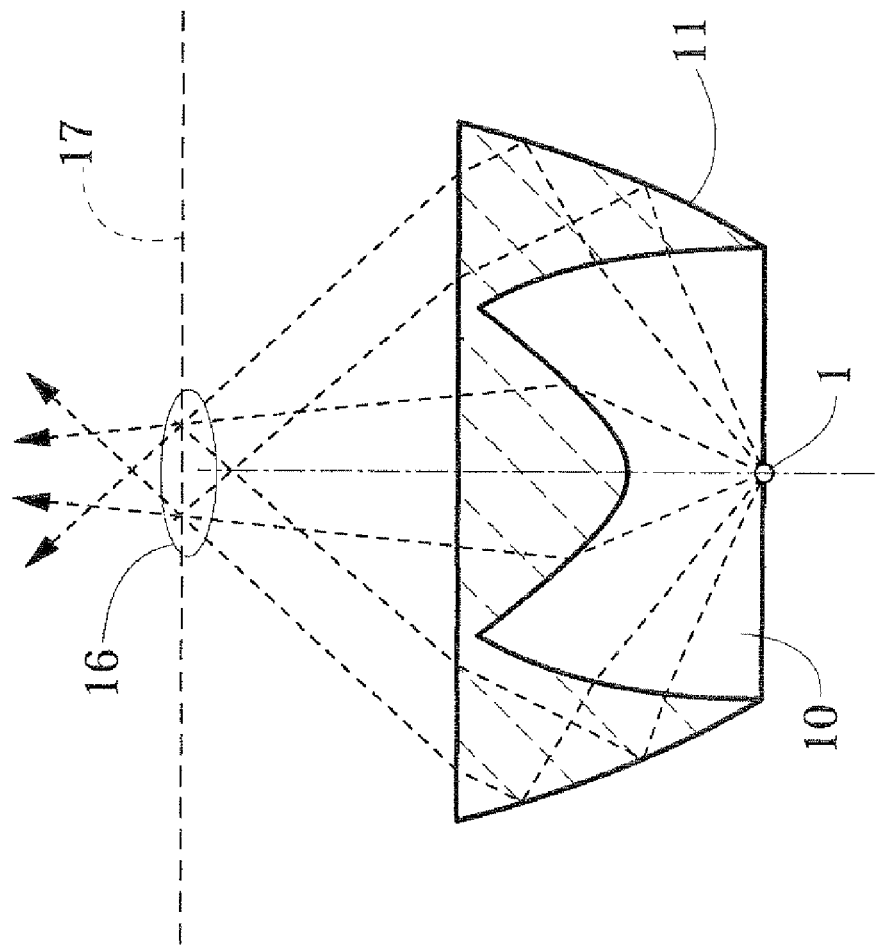
FIG. 11 illustrates the longitudinal section of a second preferred embodiment of the device according to the invention.
Figure 12:
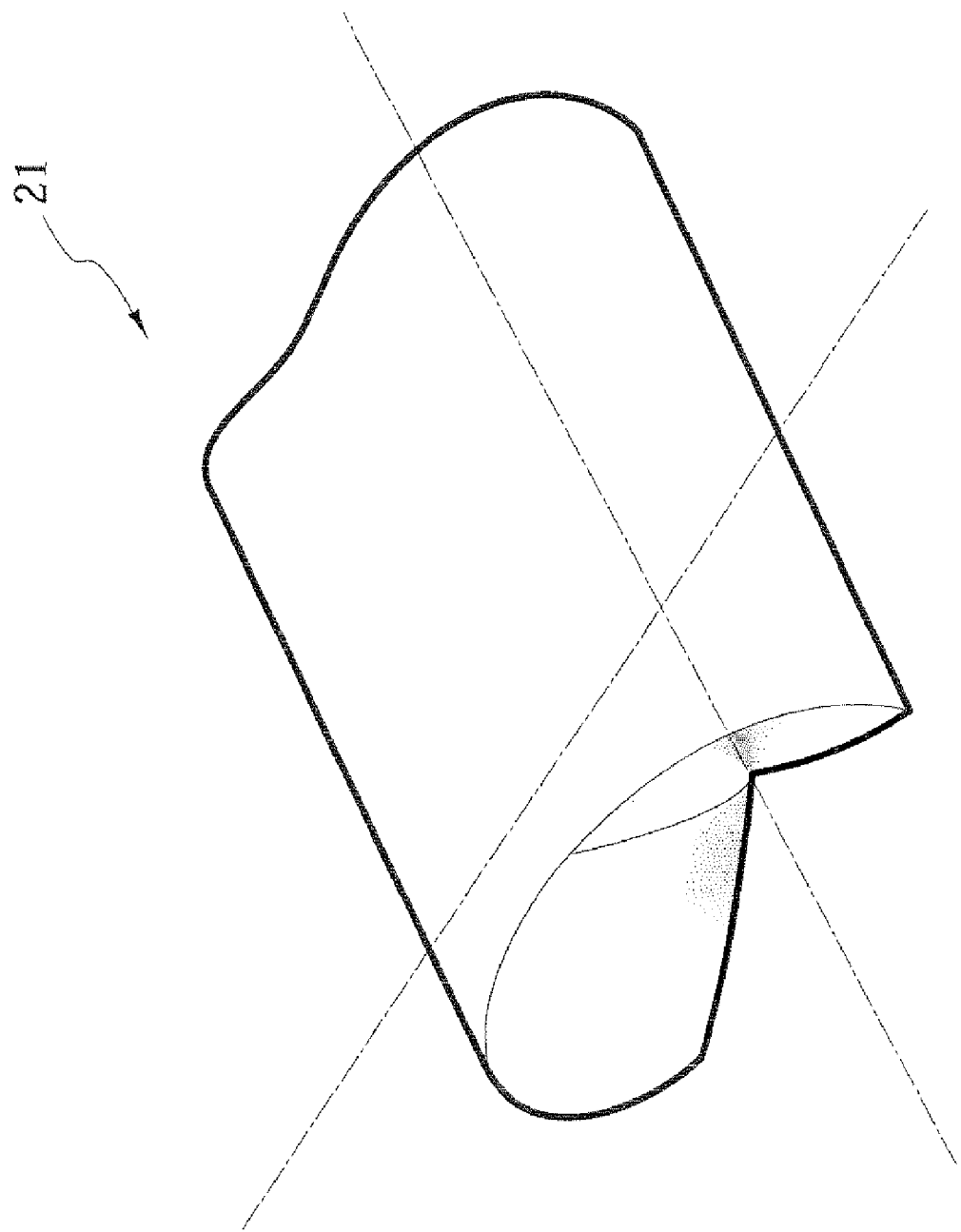
FIG. 12 is a perspective schematic view of the second preferred embodiment of the device according to the invention.
Figure 13:
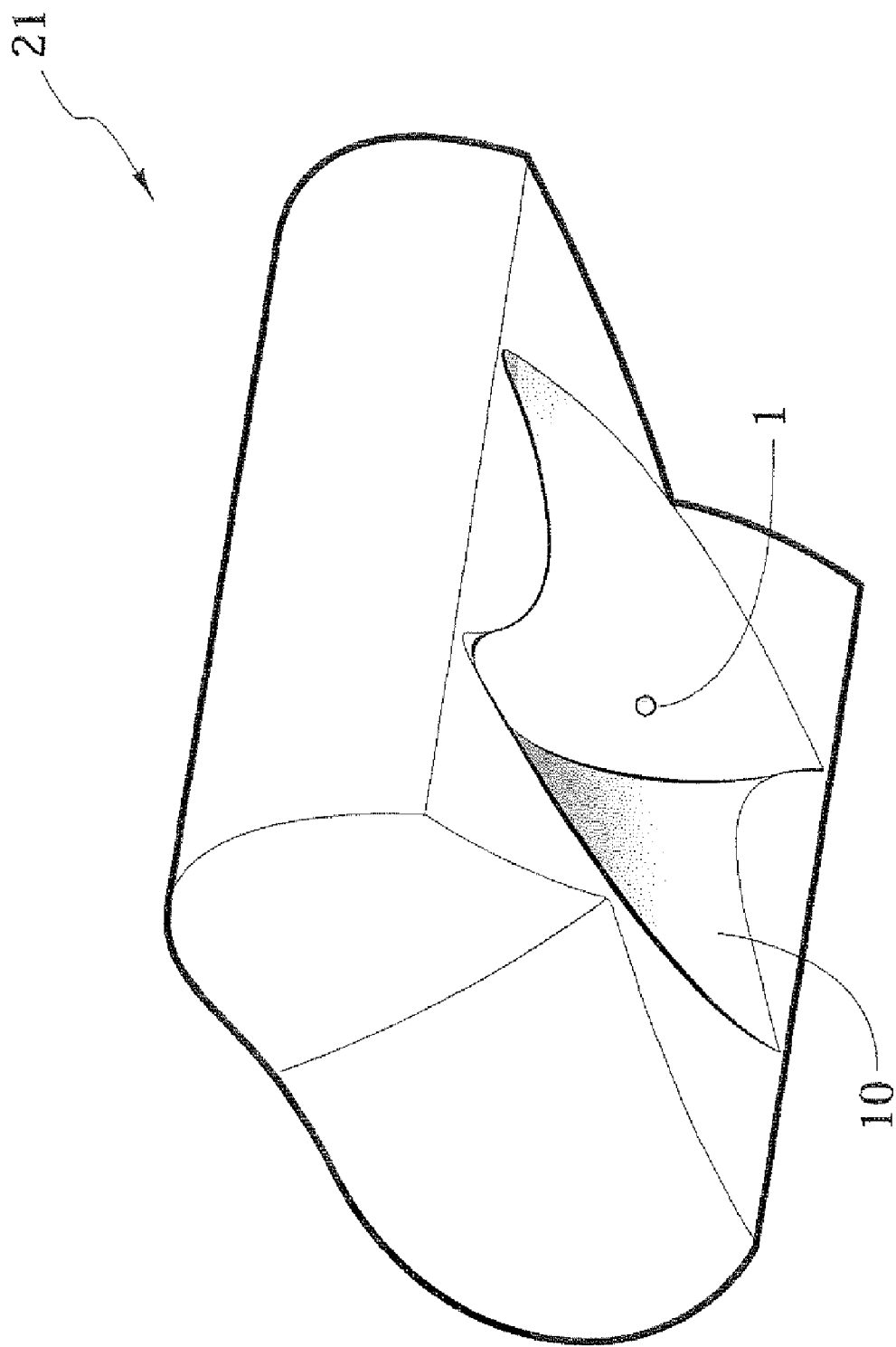
FIG. 13 is a further perspective schematic view of the second preferred embodiment of the device according to the invention.
Figure 14:
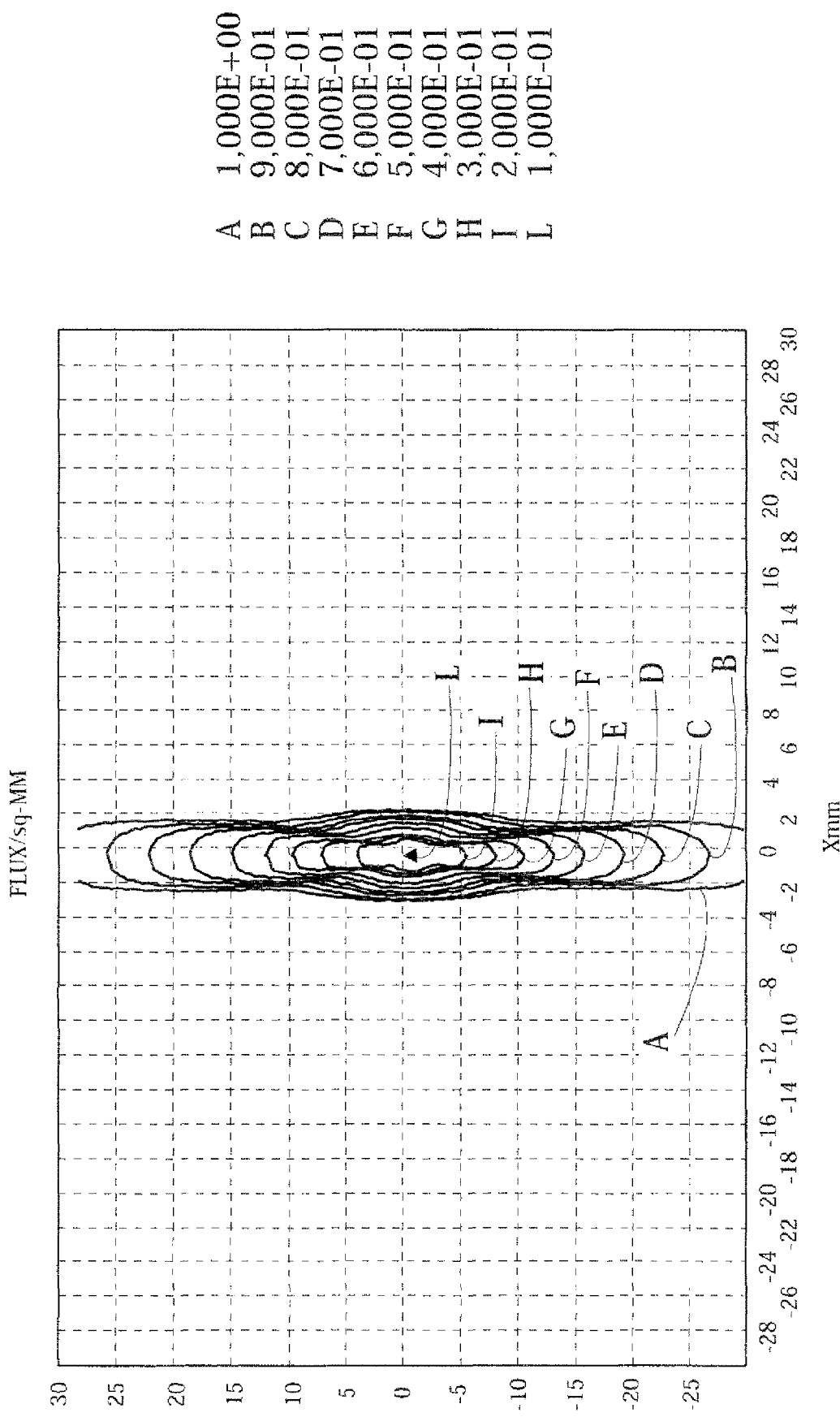
FIG. 14 illustrates an illuminance pattern typical of the second preferred embodiment of the device according to the invention, illustrated in which are lines that show the various levels of luminous intensity.

A further preferred embodiment of the device according to the invention is illustrated in FIGS. 11 to 13. In the case of said further embodiment, the device according to the invention is optimized in the form of near-field lighting device: the profile of the transverse section 11 is optimized because the beam of rays leaving the device will converge within an area of predetermined transverse linear amplitude in the plane to be illuminated 16 set at the desired distance (for example less than 20 cm) from the device. FIG. 14 illustrates a typical illuminance pattern of said second preferred embodiment of the device according to the invention, illustrated in which are lines that show the various levels of luminous intensity.

Figure 15:
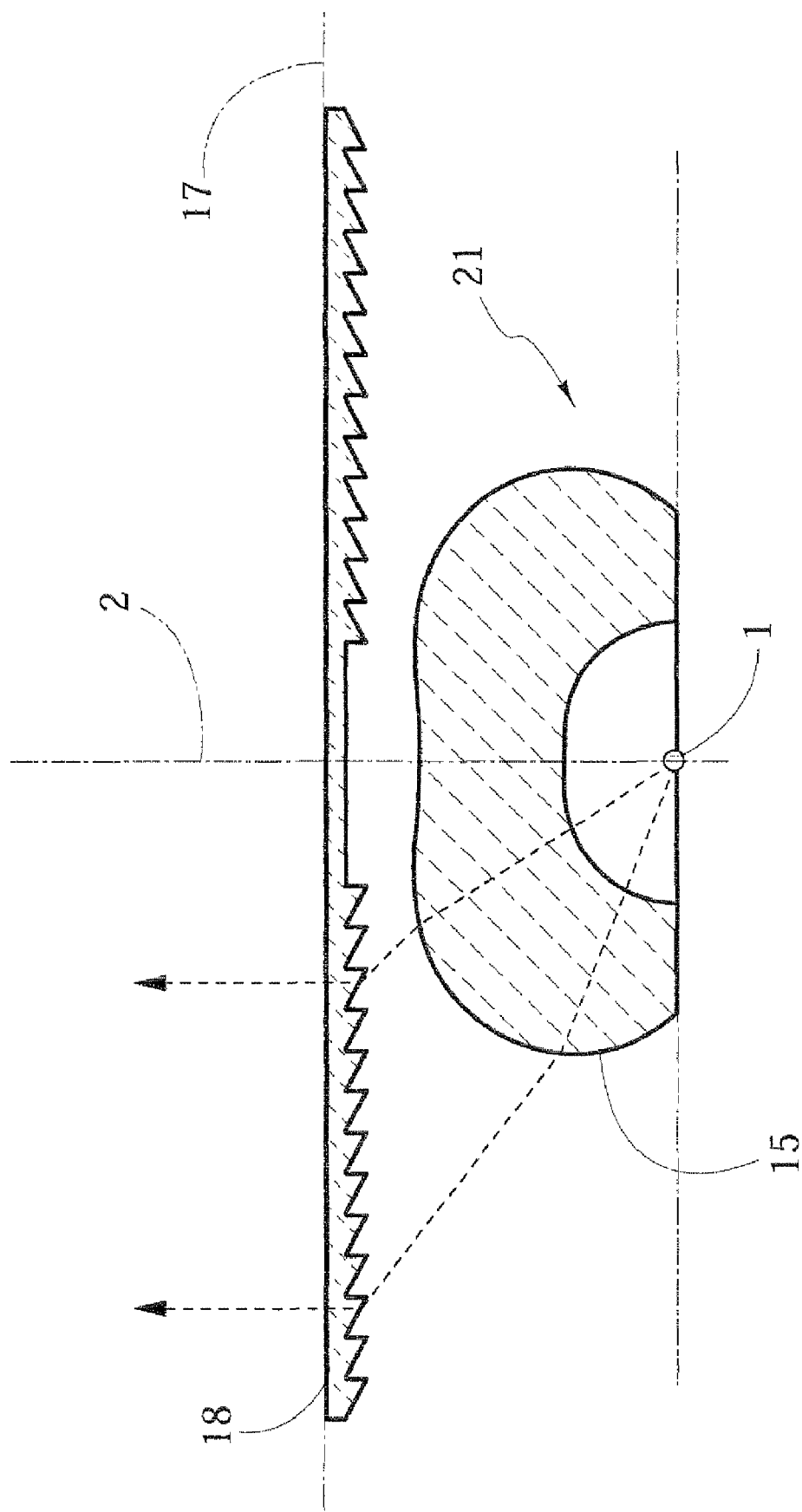
FIG. 15 illustrates the cross section of the third preferred embodiment of the device according to the invention.

A further embodiment of the device according to the invention is illustrated in FIG. 15. In the case of said further embodiment, the device according to the invention is optimized in the form of near-field lighting device with controlled illuminance. The profile of the transverse section 11 is optimized because the beam of rays leaving the device will converge within an area of predetermined transverse linear amplitude 16 in the plane to be illuminated 17 set at the desired distance, and set in said plane is a secondary optical system 18 designed to reduce the angular divergence, along at least one between the longitudinal section and the transverse section, of the beam of rays leaving the device. In a preferred embodiment, the secondary optical system 18 has a Fresnel profile.

In the design of the device according to the invention, the conformation of the surfaces of the body 21 is predetermined in order to obtain desired characteristics of illuminance in a plane 17 to be illuminated, to which reference is made. Both in the case of the embodiment of near-field lighting device and in that of far-field lighting device, the plane to be illuminated 17 can be, with respect to the main optical axis of the device:

perpendicular to said main optical axis; or inclined with respect to said main optical axis.

In the case where the plane to be illuminated is not perpendicular to the main optical axis of the device, both the profile of the transverse section 11 and the profile of the longitudinal section 15 are adapted in order to create a uniform illuminance pattern, by appropriately distributing the luminous energy emitted by the source 1.

Illuminance patterns or luminous-intensity distributions of a more complex shape with respect to a rectangle can be obtained through a modular approach, i.e., by approximating said complex patterns or distributions to patterns or distributions with a rectangular shape superimposed on one another, each of which can be obtained with a single device described in the present patent.

The light sources 1 housed within the cavity 10 can be one or more, for example, each characterized by a different colour, in order to obtain illuminance patterns or luminous-intensity distributions of variable colour.

Of course, without prejudice to the principle of the invention, the details of construction and the embodiments may vary widely with respect to what is described and illustrated purely by way of example, without thereby departing from the scope of the present invention as defined in the annexed claims.

What is claimed is:

1. A lighting device, suitable for urban lighting of interiors or exteriors, or for lighting of interiors and exteriors of motor vehicles, said device comprising:

a substantially plane substrate (20);

one or more LED or chip-LED semiconductor light sources (1) distributed over the substrate (20) and electrically connected to conductive supply paths; and an optical means (21) associated to the semiconductor source or sources, designed to modify the direction of the rays of light emitted by said semiconductor source (1), wherein:

said optical means (21) is substantially semicylindrical and consequently has a substantially plane base (6), two side faces (7), and a substantially cylindrical outer surface (8) with a longitudinal axis (9);

said optical means (21) has a cavity (10) obtained starting from said base (6) within the body of said optical means (21) and designed to house said one or more sources (1);

said outer surface (8), said side faces (7) and said cavity (10) are designed to reduce the divergence of the beam of light at output from said device with respect to the divergence of the beam from said semiconductor source, so that said device generates an illuminance pattern that is substantially uniform and has a substantially rectangular shape, with finite width and a length;

said outer surface (8) and said cavity are geometrically defined by means of a rotation about said longitudinal axis (9) of a two-dimensional cross-sectional profile (11);

said two-dimensional cross-sectional profile (11) is designed to generate a predetermined divergence beam, said profile being constituted by a central internal portion (12) constituting substantially a section of an aspherical diopter, two internal side portions (13) constituting each section of an optical surface designed to create a virtual image (1') of the source (1), two side outer portions (14) constituting each section of a surface designed to reflect the incident rays by total internal reflection, and a top outer portion (5) constituting the cross section of the surface (8) from which the rays of light leave the optical device;

said outer surface (8) has a transverse profile (15) in a central plane orthogonal to said longitudinal axis (9) such that $C=f(B)$ where:

B is the angle comprised between the direction of the rays of light as emitted by said one or more sources (1), prior to deviation thereof, projected in the plane containing the transverse profile (15) and a main optical axis (2) projected in said plane containing the transverse profile (15), R is the direction, projected in said plane containing the transverse profile (15), of a generic ray of light leaving the outer surface (8), R' is the direction, projected in said plane containing the transverse profile (15), of the same generic ray of light emitted by said one or more sources (1) prior to refraction on the outer surface (8), C is the angle comprised between said direction R and said direction R', and where f is a monotonic increasing function, such as to provide a predetermined luminous-intensity pattern.

2. The lighting device according to claim 1, wherein the surfaces of said optical means (21) are shaped in such a way that the exiting beam of light generates a substantially uniform illuminance pattern, having a substantially rectangular shape and predetermined dimensions in a plane that is substantially parallel to the base (6) of the optical means and is set at a distance greater than 20 cm from said optical means.

3. Use of a lighting device according to claim 1 for urban lighting of interiors and exteriors.

4. Use of a lighting device according to claim 1 for external or internal lights of a motor vehicle.

5. Use of a lighting device according to claim 1 for backlighting of on-board panels or displays in a motor vehicle.

* * * * *